United States Patent
Styduhar (10) Patent No.: US 7,049,857 B2
(45) Date of Patent: May 23, 2006

(54) ASYMMETRIC COMPARATOR FOR LOW POWER APPLICATIONS

(75) Inventor: Mark S. Styduhar, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 268 days.

(21) Appl. No.: 09/683,552

(22) Filed: Jan. 17, 2002

(65) Prior Publication Data
US 2003/0132786 A1   Jul. 17, 2003

(51) Int. Cl.
H03K 5/22   (2006.01)

(52) U.S. Cl. .......................... 327/63; 327/65; 327/67; 327/68

(58) Field of Classification Search ................ 327/63, 327/66, 68, 72, 77, 89, 544, 83; 330/252, 330/253
See application file for complete search history.

(56) References Cited

U.S. PATENT DOCUMENTS

| | | | | |
|---|---|---|---|---|
| 4,488,060 A | | 12/1984 | Simko ........................ 327/170 |
| 4,812,687 A | | 3/1989 | Larson et al. ................ 327/263 |
| 5,155,386 A | * | 10/1992 | Abdi .......................... 327/67 |
| 5,247,299 A | * | 9/1993 | Lim et al. ................... 341/136 |
| 5,483,184 A | * | 1/1996 | Kuo ............................. 327/83 |
| 5,498,986 A | * | 3/1996 | Manlove ...................... 327/77 |
| 5,534,811 A | | 7/1996 | Gist et al. .................... 327/309 |
| 5,557,221 A | * | 9/1996 | Taguchi et al. ............... 327/53 |
| 5,574,401 A | * | 11/1996 | Spitalny ...................... 330/253 |
| 5,808,496 A | * | 9/1998 | Thiel .......................... 327/210 |
| 5,982,218 A | | 11/1999 | Sugawara .................... 327/333 |
| 6,069,511 A | | 5/2000 | Mohan ........................ 327/171 |
| 6,229,350 B1 | * | 5/2001 | Ricon-Mora ................. 327/77 |
| 6,229,352 B1 | * | 5/2001 | Chevallier et al. ............ 327/77 |
| 6,429,141 B1 | * | 8/2002 | Van Ngo et al. ............. 438/723 |
| 6,448,821 B1 | * | 9/2002 | Sakurai ....................... 327/56 |
| 6,886,066 B1 | * | 4/2005 | Ishii ............................ 710/305 |
| 2001/0007443 A1 | * | 7/2001 | Ono ............................ 341/159 |

* cited by examiner

Primary Examiner—Tuan T. Lam
Assistant Examiner—Hiep Nguyen
(74) Attorney, Agent, or Firm—Gibb I.P. Law Firm, LLC; Richard A. Henkler, Esq.

(57) ABSTRACT

A method and structure for comparing an input signal to a reference signal using a comparator comprises a circuit for setting a trip point of a rising edge of an input signal according to a value of an external voltage reference; and at least two transistors, in the circuit, for setting a trip point of a falling edge of an input signal, according to a width-to-length ratio of the at least two transistors. Moreover, the at least two transistors comprises a first transistor of length (Lx) and a width of ($W_x$); and a second transistor of length ($L_y$) and a width of ($W_y$), wherein the width-to-length ratio equals ($W_xL_y$)/($W_yL_x$). The trip point of a falling edge of an input signal increases (decreases) by increasing (decreasing) the width-to-length ratio.

20 Claims, 9 Drawing Sheets

ASYMMETRIC COMPARATOR FOR LOW POWER APPLICATIONS

BACKGROUND OF THE INVENTION

1. Field of the Invention

The present invention generally relates to integrated circuit technology, and more particularly to electronic circuitry having different trip points for the rising and falling edges of the input signal.

2. Description of the Related Art

Prior art devices employ analog circuitry which provide an output pulse having rising and falling edges, which are independently delayed from the corresponding rising and falling edges of an input pulse. U.S. Pat. No. 4,812,687, the complete disclosure of which is herein incorporated by reference, describes such a circuit, wherein the circuit function occurs by using a charging capacitor, which drives a Schmitt trigger.

In this prior art circuit, the charge on the capacitor is determined by a first constant current source and a switch responsive to the rising edge of the input pulse, and a corresponding second constant current source and a switch responsive to the falling edge of the input pulse. Furthermore, it is taught that by varying the width-to-length ratio of the device, the value of the charge-up current and discharge current can be controlled.

Those skilled in the art would readily appreciate the functions of a Schmitt trigger which provides a low state output signal when its input receives a voltage input equal to or less than a low voltage trigger value, and a high state output signal when its input receives a voltage input equal to or higher than a high trigger value. Additionally, for input voltages between the low trigger value and the high trigger value, the Schmitt trigger remains in an unswitched condition.

Other prior art circuits teach various ways of controlling the input signal, thereby controlling the corresponding rise and fall times of the signal, such as U.S. Pat. No. 4,488,060 (teaching a high voltage ramp rate control circuit providing a controllable ramp rate action useful in high voltage power supplies); U.S. Pat. No. 5,534,811 (teaching a driver circuit having an input terminal fed by a logic signal and producing a drive signal having selectable rise and fall time characteristics in accordance with a reference voltage provided to the driver); U.S. Pat. No. 5,982,218 (teaching an input circuit provided in a semiconductor integrated circuit used in a high-speed small-amplitude signal transmission system having a ratio of gate length to gate width in a PMOS transistor of 1:4, and a ratio of gate length to gate width in a NMOS transistor of 1:40); and U.S. Pat. No. 6,069,511 (teaching a signal shaping circuit for use in a transmission line driver, wherein the input is a pulse signal having a rising edge that triggers a delay circuit which produces a first sequence of multiple delayed outputs and a falling edge which triggers the delay circuit to produce a second sequence of multiple delayed outputs, and wherein, by controlling the first and second delayed output, the rise and fall times of the output signal can be precisely controlled), the complete disclosures of which are herein incorporated by reference.

However, the conventional circuits often result in poor power dissipation rates and, as such, may not be applicable in low power applications. Furthermore, the conventional circuits do not provide for a different trip point for the rising and falling edges of the input signal.

This capability is very important because it provides the ability to control the timing relationship between the output transitions of the comparator corresponding to the rising and falling edges of the input signal. Furthermore, it allows for the control of the delay between rising and falling output transitions out of the comparator. It also provides the capability to vary the positive or negative pulse width of the comparator output signal. Thus, there is a need for a comparator having different trip points for the rising and falling edges of the input signal which dissipates less power than the conventional comparator devices, and which is ideal for use in low power applications.

BRIEF SUMMARY OF THE INVENTION

In view of the foregoing and other problems, disadvantages, and drawbacks of the conventional comparator devices, the present invention has been devised, and it is an object of the present invention, to provide a structure and method for a novel comparator having different trip points for the rising and falling edges of the input signal. It is another object of the present invention to provide a novel comparator which dissipates less power than conventional comparator devices. Yet another object of the present invention is to provide a comparator which is analog for part of the comparison cycle and digital for the remainder of the comparison cycle. Still another object of the present invention is to provide a comparator which is ideal for use in low power applications.

In order to attain the objects suggested above, there is provided, according to one aspect of the invention, a comparator comprising at least two transistor, wherein the comparator is set to have a first trip point corresponding to a rising edge of an input signal according to a value of an external voltage reference, and a second trip point corresponding to a falling edge of the input signal according to the width to length ratio of the at least two transistors.

The comparator cycles between an analog circuit and a digital circuit, wherein in the analog circuit, one of the at least two transistors is a tail current source transistor, and wherein the input signal rises from ground toward a positive power supply voltage $V_{CC}$, wherein the rise in the input signal switches the tail current source transistor off. Additionally, in the case where the input signal falls from $V_{CC}$ toward ground or GND, as long as the falling input signal is less than the falling edge trip voltage, a tail current source transistor is on.

Furthermore, the comparator further comprises a plurality of transmission gates in the circuit, wherein as long as the rising input signal is less than the external reference voltage and the falling input signal is less than the falling edge trip voltage, the transmission gates cause the comparator to appear as a differential pair in an open loop configuration with a current mirror load.

Also, in the digital circuit, the voltage of the rising input signal is greater than the external reference voltage and the voltage of the falling input signal is greater than the falling edge trip voltage set by the width-to-length ratio of the two transistors. Additionally, the input signal causes the comparator to appear as an asymmetric inverting Schmitt trigger.

Moreover, the transistors include a first transistor of width ($W_x$) and length ($L_x$); and a second transistor of width ($W_y$) and length ($L_y$), wherein the width-to-length ratio equals $(W_x L_y)/(W_y L_x)$. The trip point of a falling edge of an input signal increases (decreases) by increasing (decreasing) the width-to-length ratio. Moreover, as the input signal decreases, a switching threshold becomes dependent on the width-to-length ratio.

The inventive comparator acts upon two unique trip points, one for the rising and one for the falling edge of the input signal, but only requires one of them to be externally provided. It provides hysteresis during a falling input transition and thus provides for greater noise immunity.

The ability to raise and lower the trip point of the falling edge of an input signal is important because it allows for the adjustment of the amount of hysteresis incorporated into the design. Another important use of an adjustable trip point involves the ability to control the delay between the rising and falling edge transitions at the comparator output signal and, in turn, the pulse width at the output. This use has several applications where the same analog signal is used to generate or derive a digital data signal as well as a digital clock signal.

BRIEF DESCRIPTION OF THE SEVERAL VIEWS OF THE DRAWINGS

The foregoing and other objects, aspects and advantages will be better understood from the following detailed description of a preferred embodiment of the invention with reference to the drawings, in which.

DETAILED DESCRIPTION OF THE INVENTION

Detailed Description of Preferred Embodiments of the Invention

As previously mentioned, there is a need for a comparator having different trip points for the rising and falling edges of the input signal which dissipates less power than the conventional comparator devices, and which is ideal for use in low power applications. The present application describes a novel comparator circuit which has different trip points for the rising and falling edges of the input signal.

A trip point is a voltage level that, when passed through by a comparator input signal whose voltage is increasing or decreasing, will result in a transition at the output of the comparator.

Figure 1:
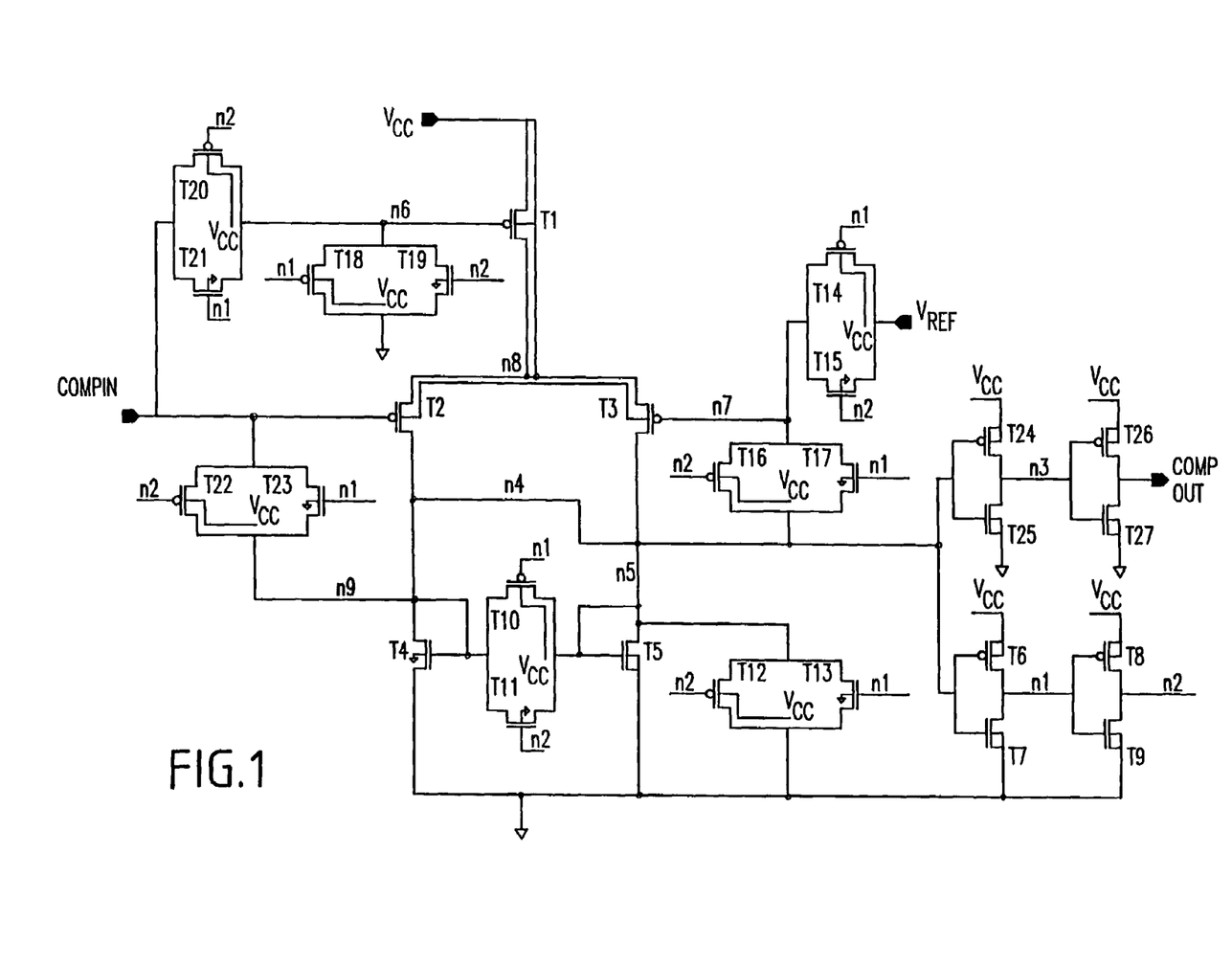
FIG. 1 is a schematic diagram of the circuit according to the present invention.

With the inventive structure shown in FIG. 1, the trip point for the rising edge of the input signal is determined by an external reference voltage $V_{REF}$. Furthermore, with the invention, the trip point for the falling edge of the input signal is determined by the width-to-length ratio of two PMOS transistors. In a preferred embodiment, the invention is suitable for applications where a comparator with hysteresis is required. Hysteresis is evident by the fact that there is a unique trip point or trigger voltage $V^+$ for a rising input signal voltage and a unique trip point $V^-$ for a falling input signal voltage. The hysteresis voltage is defined as $VH=V^+-V^-$.

The invention also dissipates less power than a conventional comparator since the tail current is minimal when the comparator is in the digital configuration which, as will be shown later, occurs during more than half of the comparison cycle.

Referring now to the drawings, and more particularly to FIGS. 1–9, there are shown preferred embodiments of the present invention. Specifically, in FIG. 1, a comparator is shown comprising a circuit for setting a trip point of a rising edge of an input signal COMPIN according to a value of an external voltage reference $V_{REF}$, and at least two transistors (T1 and T3) in the circuit, for setting a trip point of a falling edge of the input signal according to a width-to-length ratio of the at least two transistors (T1 and T3). The comparator cycles between an analog circuit and a digital circuit. Moreover, the trip point of the falling edge of the input signal increases (decreases) by increasing (decreasing) the width-to-length ratio of the at least two transistors (T1 and T3). The width-to-length ratio is indicated by $(W_xL_y)/(W_yLx)$, where $W_x$ and $L_x$ are the width and length of the first transistor T1, and $W_y$ and $L_y$ are the width and length of the second transistor T3. Moreover, as the input signal COMPIN decreases, a switching threshold becomes dependent on the width-to-length ratio of the at least two transistors (T1 and T3).

In FIG. 1, the tail current is the DC or static current flowing from $V_{CC}$ through transistor T1 and eventually to GND via the current paths formed by transistors T3 and T5 and/or T2 and T4. A comparison cycle consists of a minimal number of transitions at the comparator input resulting in the transition output from high-to-low-to-high or from low-to-high-to-low. Typically, this minimum number of input transitions is two. For example, to illicit the high-to-low-to-high response at the output, during the first transition, the input signal rises in voltage from near GND toward $V_{CC}$ with the requirement that it cross the external reference voltage value. In the second transition, the input signal falls in voltage from near $V_{CC}$ toward GND with the requirement that it cross the falling edge trip voltage set by the width-to-length ratio of the at least two transistors.

The inventive comparator can be considered analog for part of the cycle and digital for the remainder of the cycle, making it ideal for use in low power applications. The distinction between the analog and digital configurations is determined, in large part, by the presence or absence of static DC current paths as well as the region of operation of the transistors. In the analog configuration, there are static DC current paths present and certain transistors operate in the region known as saturation. In the digital configuration, static DC current paths are absent and the transistors are either operating in the linear (triode) region or cutoff region. When the input signal COMPIN rises from GND toward $V_{CC}$, the tail current source transistor T1 switches on.

Figure 3:
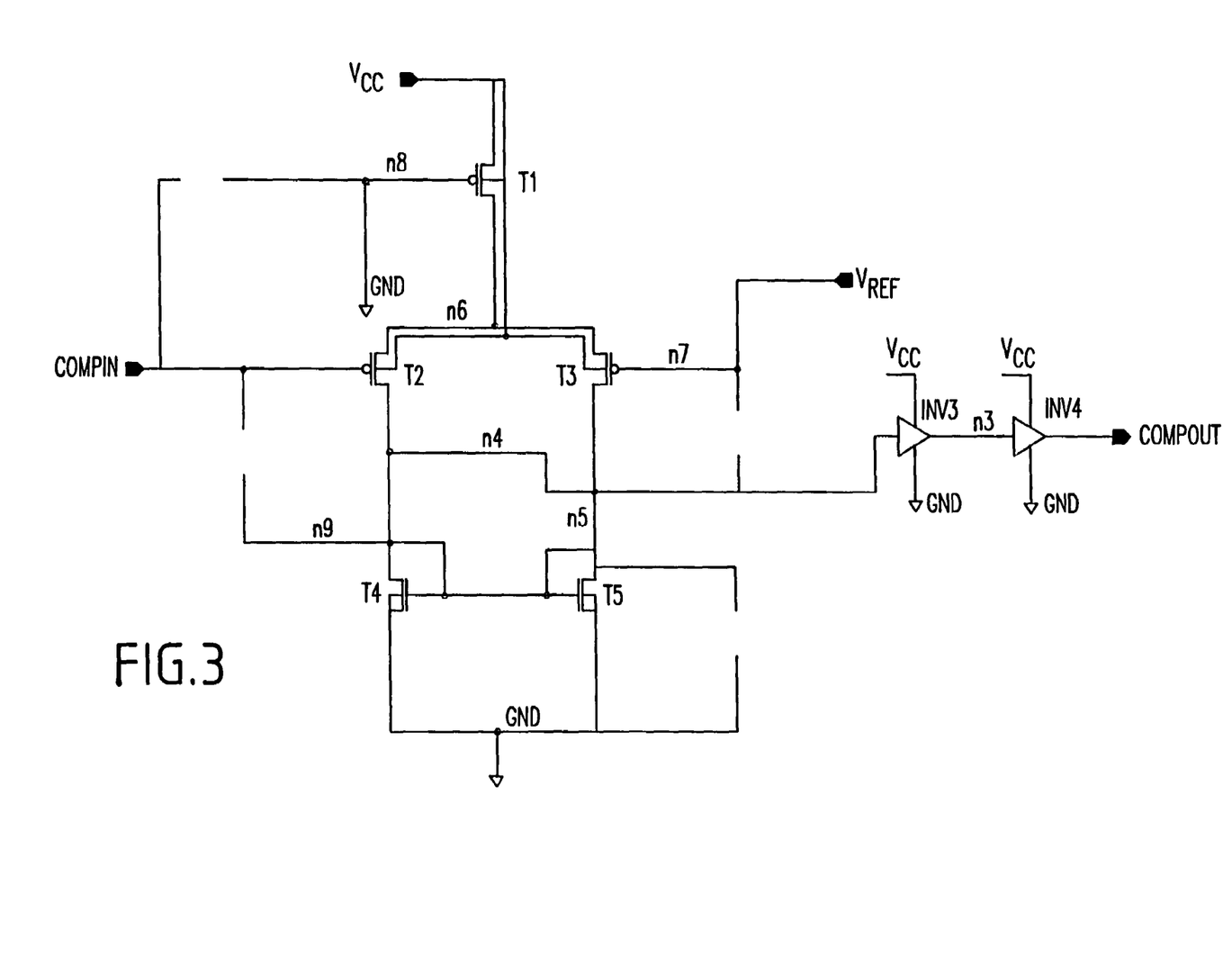
FIG. 3 illustrates the analog configuration of FIG. 2.
Figure 4:
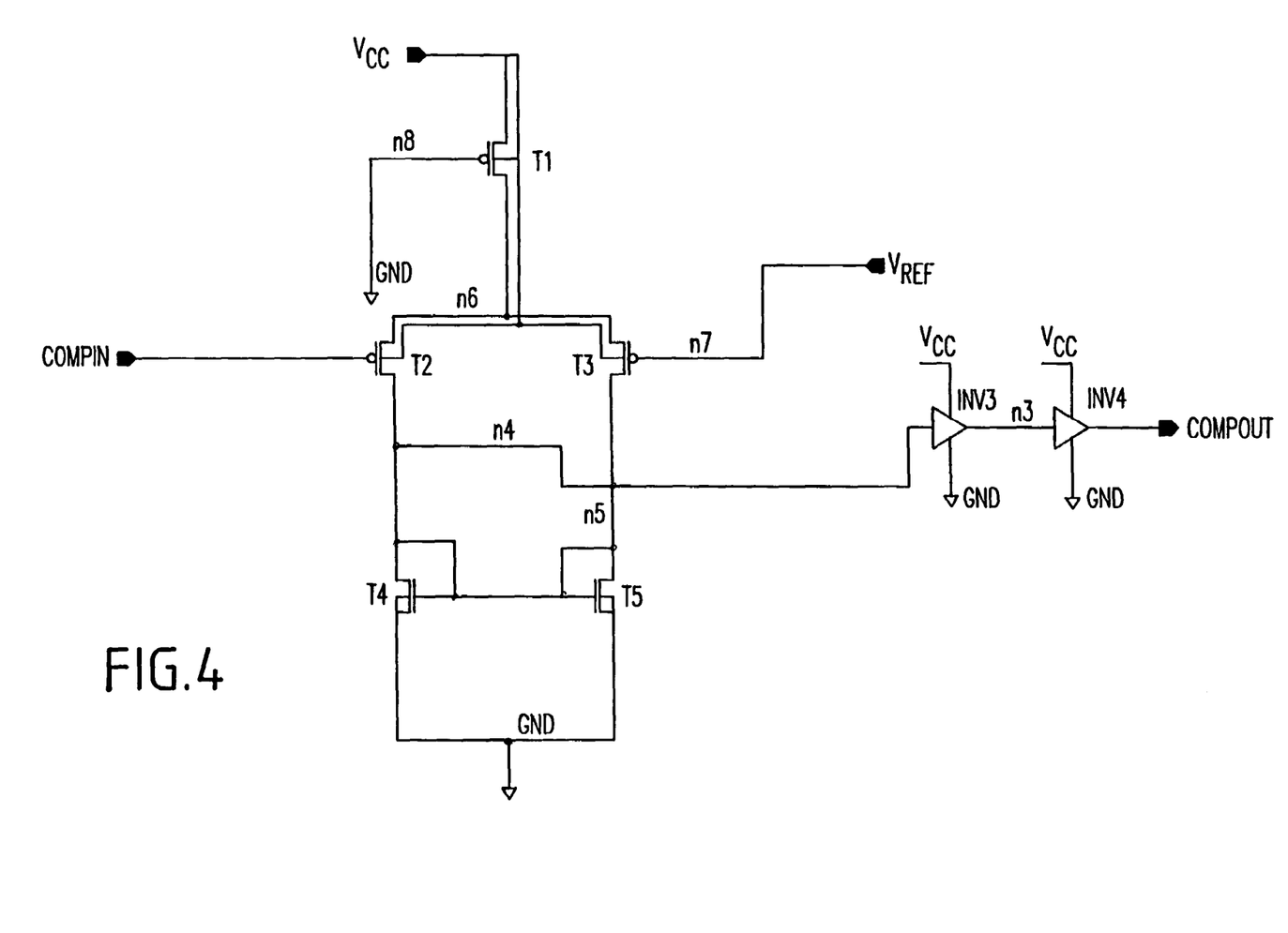
FIG. 4 is an alternate representation of the analog configuration of FIG. 3.

In FIG. 1, when the comparator input signal COMPIN is of sufficiently low voltage, the comparator is in the analog configuration since there is static DC current flowing through tail current source transistor T1, continuing through transistors (T2 and T4) and/or transistors (T3 and T5) to GND. In this situation, transistors T2, T3, T4, and T5 are generally in saturation. FIGS. 3 and 4, as will be described later, depict the inventive comparator in the analog configuration.

Figure 5:
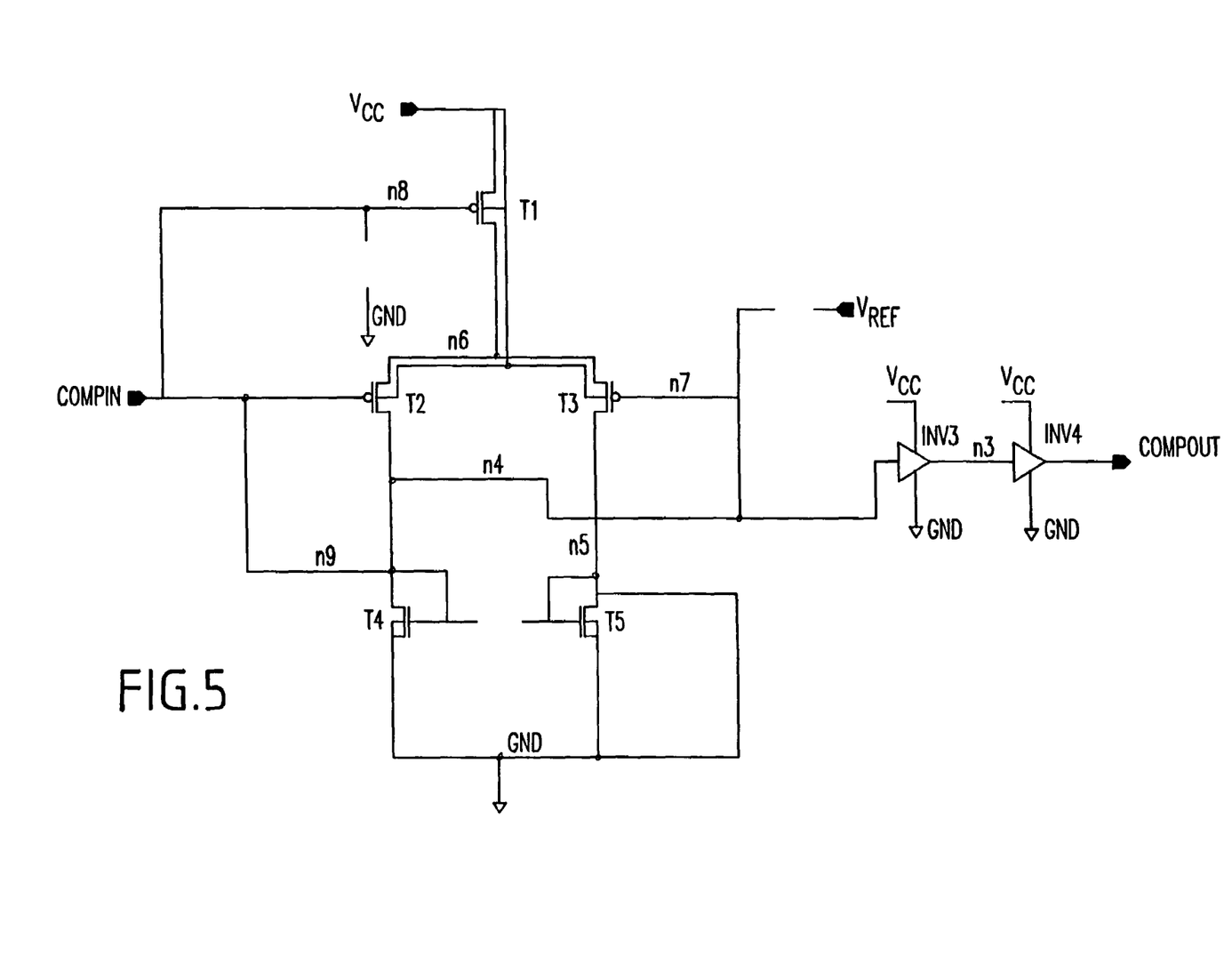
FIG. 5 illustrates the digital configuration of FIG. 2.
Figure 6:
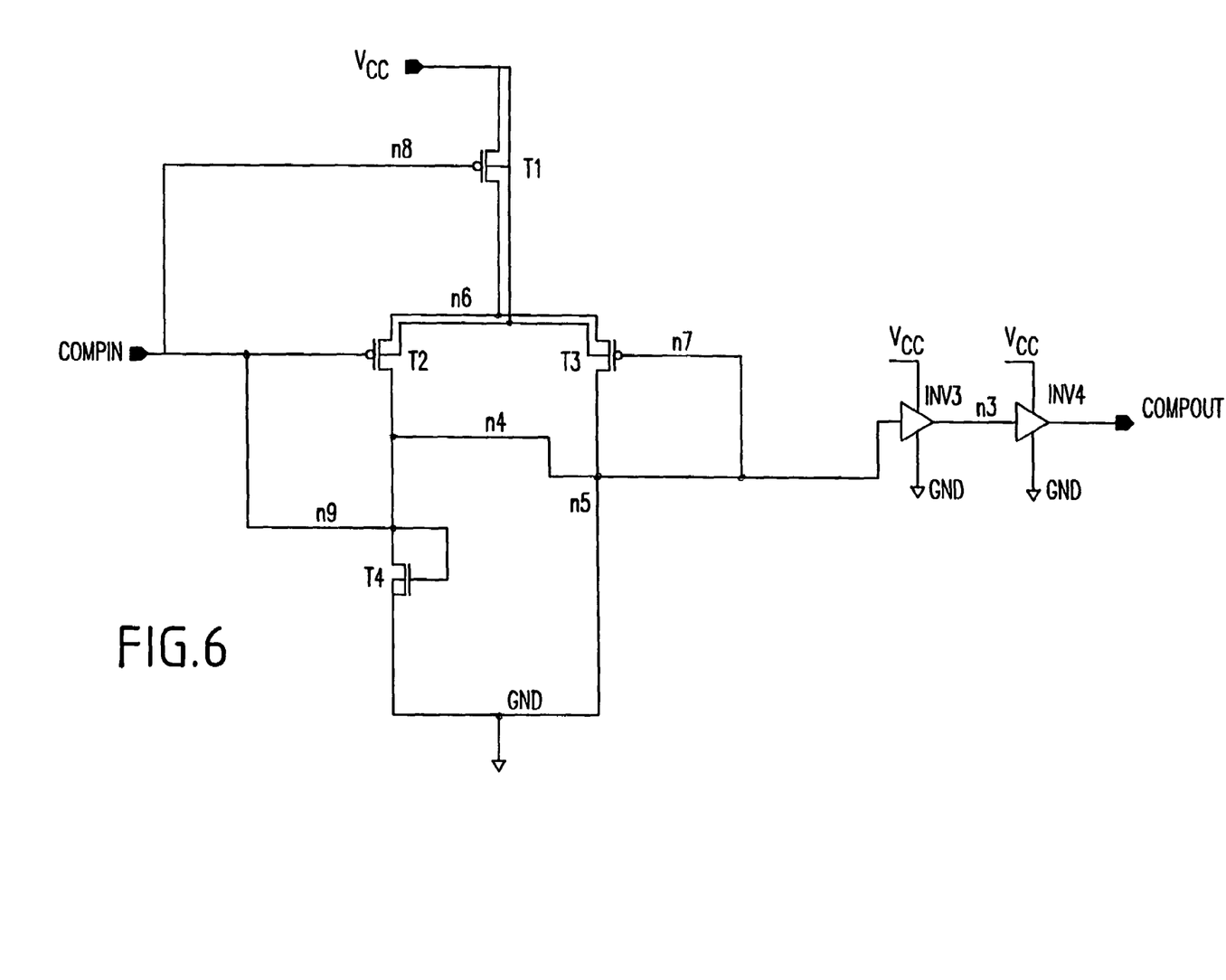
FIG. 6 is an alternate representation of the digital configuration of FIG. 5.

When the comparator input signal COMPIN is of sufficiently high voltage, the comparator is in the digital configuration since there is no static DC current flowing and the transistors are operating either in the linear (triode) region or in the cutoff region. Specifically, transistors T1, T2, and T5 are in cutoff while transistors T3 and T4 are in the linear (triode) region. FIGS. 5 and 6, as will be described later, depict the inventive comparator in the digital configuration.

FIG. 1 shows a complete schematic of the circuit according to the present invention. This schematic includes a PMOS tail current source transistor T1, a PMOS differential transistor pair T2/T3, and an NMOS current mirror load for the differential pair consisting of transistors T4/T5. The circuit further includes four CMOS inverters made of PMOS/NMOS transistor pairs T6/T7, T8/T9, T24/T25, and T26/T27. Moreover, the circuit includes seven CMOS transmission gates, used as switches, being constructed of parallel-connected PMOS and NMOS transistors. Specific examples of these transmission gates include transistor pairs T10/T11, T12/T13, T14/T15, T16/T17, T18/T19, T20/T21, and T22/T23. Moreover, a rise in the signal COMPIN causes the comparator to appear as a differential pair in an open loop configuration. Furthermore, the circuit includes four pins or terminals described as COMPIN, $V_{REF}$, COMPOUT, and $V_{CC}$, all of whose voltages are referenced to ground or GND, COMPIN is the comparator input signal, $V_{REF}$ is the external comparator reference voltage input, COMPOUT is the comparator output signal, $V_{CC}$ is the positive power supply voltage, and ground or GND is assumed to be zero volts.

Regarding the device sizes, the differential pair transistors T2/T3 are identical, as are the current mirror load transistors T4/T5. All seven transmission gates are identical, and the PMOS and NMOS transistors in each are of minimum channel length and are of large enough channel width such that the on resistance of these switches is negligible. Inverters consisting of transistors T6/T7 and T8/T9 are of the same size, as follows. The PMOS devices have a W/L ratio of 1/66.66 with W being approximately two times the minimum allowed by the technology. The NMOS devices have a W/L ratio on the order of 133.33/1 with L being the minimum allowed by the technology. The inverter, consisting of transistors T24/T25 is sized as follows. The PMOS device has a W/L ratio of 1/11.11 with W being approximately two times the minimum allowed by the technology. The NMOS device has a W/L ratio of 22.22/1, with L being the minimum allowed by the technology. The inverter, consisting of transistors T26/T27, is sized as follows. The PMOS device has a W/L ratio of 355.55/1, with L being approximately the minimum allowed by the technology.

Figure 2:
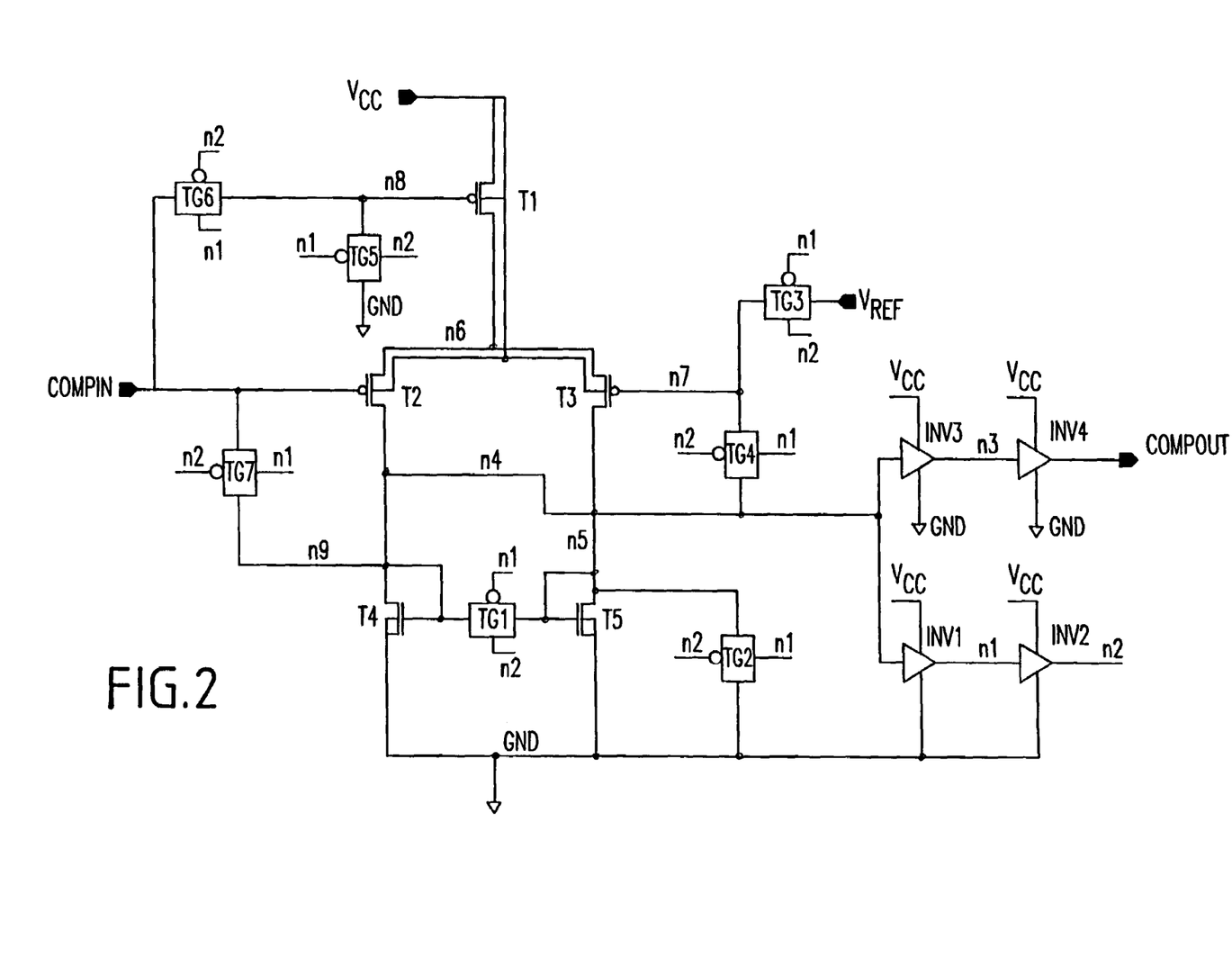
FIG. 2 is an alternate representation of the circuit in FIG. 1.

FIG. 2 shows a simplified form of the schematic of FIG. 1 to aid in the understanding of the complete invention. In FIG. 2, the seven transmission gates have been replaced with their symbolic representation (TG1 to TG7), as have the four inverters (INV1 to INV4). The transmission gates are four terminal devices where two of the terminals connect to the signal path through the element and the other two terminals are the control signals consisting of the complementary nodes n1 and n2 from the output of inverters INV1 and INV2, respectively.

Depending on the state of nodes n1 and n2, there will be either a conductive signal path through the transmission gate such that it appears as a short circuit, or a high impedance state will exist which acts as an open circuit in the signal path. For example, regarding TG1, if node n1 is a logic low and node n2 is a logic high, TG1 will be considered to be in the ON state, in which case the switch will be closed and the signal path through the transmission gate will be complete and conductive. Conversely, if node n1 is a logic high and node n2 is a logic low, TG1 will be considered to be in the OFF state, in which case the switch will be opened and in a high impedance nonconductive state.

The behavior of the inventive comparator circuit, with reference to FIG. 2, is as follows. An assumption is made that at the outset, the condition of the circuit is in a state such that voltage at input pin COMPIN is very near GND and is rising from GND toward VCC, the positive power supply rail. Also, at the outset, the voltage at node n4 is initially high enough to cause the voltage at node n3, the output of inverter INV3, to be a logic low and the voltage at node COMPOUT, the output of inverter INV4, to be a logic high. Similarly, the voltage at node n4 is initially high enough to cause the voltage at node n1, the output of inverter INV1, to be a logic low and the voltage at node n2, the output of inverter INV2, to be a logic high. These node voltages n1 and n2 are the control signals propagated to all seven transmission gates and they determine whether the transmission gates are in the opened or closed state. At the outset, the transmission gates TG2, TG4, TG6, and TG7 are in the opened or high impedance state and TG1, TG3, and TG5 are in the closed or short circuit state.

FIG. 3 shows an analog illustration of FIG. 2, whereby the transmission gates have been removed and replaced by either an open circuit or short circuit. Inverters INV1 and INV2 have been omitted as well because their outputs are only used as inputs to the now deleted transmission gates. FIG. 4 shows an alternate representation of FIG. 3, whereby all dangling nets or stubs have been removed to aid in the understanding of the circuit more completely. FIG. 4 represents the analog configuration of the inventive comparator of FIG. 1, wherein there is static DC current flow, and transistors T2, T3, T4, and T5 operate predominantly in the saturation region. In this configuration, the gate of PMOS tail current transistor T1 is shorted to GND potential which turns it on and allows static DC current to flow from $V_{CC}$ through T1 into the PMOS differential pair transistors T2/T3 and onto GND through current mirror load transistors T4/T5. This analog transformation is essentially a differential pair in an open loop configuration with a current mirror load.

Figure 7:
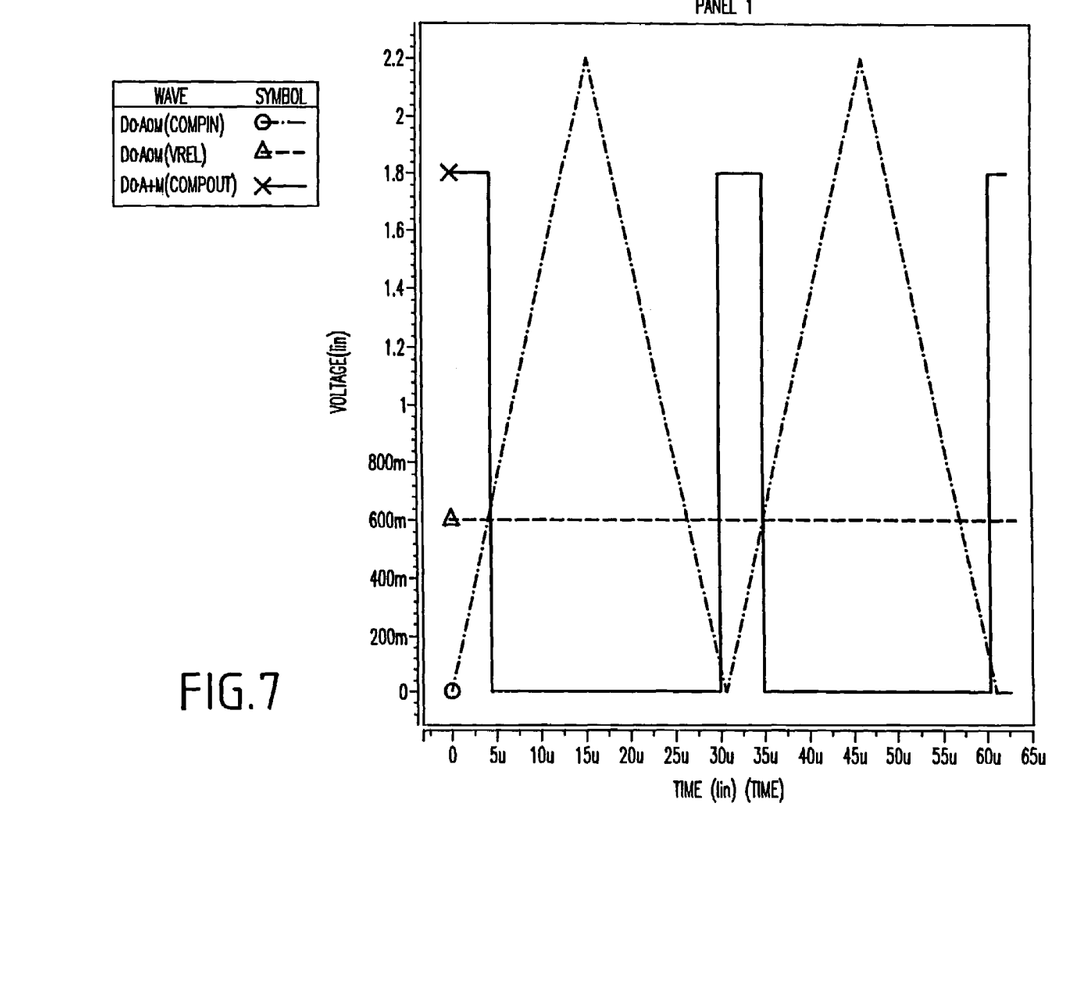
FIG. 7 shows the graphical results from an HSPICE circuit simulation of the asymmetric comparator.

This outset condition is shown in the graphical HSPICE circuit simulation results of FIG. 7 at time 0 μs. FIG. 7 shows three wave forms, including the external reference voltage $V_{REF}$, which maintains a fixed voltage of 600 mV throughout the simulation depicted by the wave form having the triangle symbol at its left edge. The COMPIN signal, indicated by the circle symbol on the left edge of its wave form, is a periodic triangularly shaped wave form varying in amplitude between 0 V and 2.2 V wit a period of approximately 31 μs. The COMPOUT signal, shown by the wave form indicated with an X symbol at the left edge of the waveform, varies between 0 V and 8 V in amplitude. At time 0 μs, $V_{REF}$ is 600 mV, COMPIN is 0 V, and COMPOUT is 1.8 V.

As the COMPIN voltage continues to rise and becomes greater than the reference voltage at the $V_{REF}$ pin, the voltage at node n4 sinks toward GND and the voltage at node n5 rises because the differential pair acts to allow less current to flow through T2 and more current to flow through T3. Less current flowing through T2 equates to less current flowing through T4 and less voltage being developed across T4 according to Ohm's law (V=I×R, where R is the resistance of transistor T4). The decrease in the voltage at node n4 causes inverter INV1 to switch and the voltage at node n1 to assume a logic high, which causes inverter INV2 to switch and the voltage at node n2 to assume a logic low. Similarly, the decrease in the voltage at node n4 causes inverter INV3 to switch and the voltage at node n3 to assume a logic high which causes inverter INV4 to switch and the voltage at node COMPOUT to assume a logic low.

This situation is shown In the HSPICE circuit simulation results of FIG. 7 at time 5 μs, where the rising COMPIN voltage crosses the trip point voltage of 600 mV set by $V_{REF}$. This causes the COMPOUT voltage to fall to 0 V. In this state, the seven transmission gates of FIG. 1 and FIG. 2 change their state since the control voltages at nodes n1 and n2 have changed their polarity. Thus, transmission gates, which were previously opened, are now closed and vice-versa.

This is further depicted in FIG. 5, which shows the digital configuration of FIG. 2, and where the transmission gates have been removed and replaced with either an open or short circuit. Moreover, the input signal COMPIN is at an input voltage greater than the external reference voltage $V_{REF}$. Inverters INV1 and INV2 have been removed for clarity as well. Furthermore, FIG. 6 illustrates an alternate representation of FIG. 5, whereby all dangling nets or stubs have been removed to aid the in understanding of the circuit more completely. Additionally, in FIG. 5, a short circuit exists across transistor T5, which is why it is not present in FIG. 6. Also in FIG. 5, the $V_{REF}$ pin is unconnected and, therefore, it is not represented in FIG. 6. FIG. 6 further represents the digital configuration of the inventive comparator of FIG. 1 because there are no static DC current paths, and transistors are operating in either the linear (triode) or cutoff regions. As a result, in this configuration, minimal power is being dissipated which makes the present invention ideal for low power applications. Furthermore, FIG. 6 provides the characteristics of an asymmetric inverting Schmitt trigger.

As the COMPIN voltage begins to fall, indicated at a time of approximately 16 μs in FIG. 7, the trip/point becomes dependent on the width-to-length ratio $(W_{T1}/L_{T1})/(W_{T3}/L_{T3})$ which is equivalent to $(W_{T1}/L_{T3}/L_{T3}/W_{T3})$ for transistors T1 and T3. In the Schmitt trigger of FIG. 6, transistor T2 is the main switching device, while T1 and T3 act as a feedback network that controls the falling edge trip point. By adjusting the aspect ratio of these two transistors, the falling edge trip point V− can be controlled. For a Schmitt trigger, V− is defined in the literature in equation form as:

$$V^- = [SQRT\{(W_{T1}/L_{T1})(L_{T3}/W_{T3})\}\{V_{CC}-V_{tp}\}]/[1+ SQRT\{(W_{T1}/L_{T1})(L_{T3}/W_{T3})\}]$$
Equation 1 where SQRT{ } represents the square root function, $W_{T1}/L_{T1}$ and $L_{T3}/W_{T3}$ are the width-to-length and length-to-width ratios, respectively, of transistors T1 and T3, $V_{CC}$ is the positive power supply voltage, and VTp is the threshold voltage of a PMOS transistor such as T1 or T3. As an example of using Equation 1, assuming a $V_{CC}$ of 1.8V and VTp of 0.4V, the value of V− changes in relation to SQRT$\{(W_{T1}/L_{T1})(L_{T3}/W_{T3})\}$ and $(W_{T1}/L_{T1})(L_{T3}/W_{T3})$ as indicated in Table 1.

TBLE 1

| SQRT{$W_{T1}/L_{T1})(L_{T3}/W_{T3})$} | $(W_{T1}/L_{T1})(L_{T3}/W_{T3})$ | V(Volts) |
|---|---|---|
| 0.125 | 0.0156 | 0.156 |
| 0.250 | 0.0625 | 0.280 |
| 0.500 | 0.2500 | 0.467 |
| 1.000 | 1.0000 | 0.700 |
| 2.000 | 4.0000 | 0.933 |
| 4.000 | 16.0000 | 1.120 |

TBLE 1-continued

| SQRT{$W_{T1}/L_{T1})(L_{T3}/W_{T3})$} | $(W_{T1}/L_{T1})(L_{T3}/W_{T3})$ | V(Volts) |
|---|---|---|
| 8.000 | 64.0000 | 1.244 |
| 16.000 | 256.0000 | 1.318 |
| 32.000 | 1024.0000 | 1.358 |
| 64.000 | 4096.0000 | 1.378 |
| 128.000 | 16384.0000 | 1.389 |

As the value of SQRT$\{(W_{T1}/L_{T1})(L_{T3}/W_{T3})\}$ increases or decreases, the value of the expression $(W_{T1}/L_{T1})(L_{T3}/W_{T3})$ also increases or decreases, respectively. Thus, the results in Table 1 indicate that for the falling edge of COMPIN to raise the trigger point, the width and length of T1 and T3 are adjusted such that the quantity $(W_{T1}/L_{T1})(L_{T3}/W_{T3})$ increases. Conversely, to lower the trigger point, the width and length of T1 and T3 are adjusted such that the quantity $(W_{T1}/L_{T1})(L_{T3}/W_{T3})$ decreases.

As the COMPIN voltage continues to fall between times 16 μs and 31 μs in FIG. 7, it crosses the $V_{REF}$ voltage of 600 mV with no change occurring in COMPOUT. Continuing the voltage descent, COMPIN passes through the 110 mV mark at a time of approximately 30 μs which results in COMPOUT transitioning from 0 V to 1.8 V. This indicates that the inventive comparator has transformed itself back into the analog configuration, which was evident at the outset because COMPIN falls below the trip point established by the aspect ratios of transistors T1 and T3.

Furthermore, the transmission gate control nodes n1 and n2 also change polarity and return to the initial value they held at time 0 μs in FIG. 7. FIG. 7 shows two comparison cycles with each cycle approximately 31 μs in duration. In the first comparison cycle between times 0 μs and 31 μs, the inventive comparator is in the analog configuration between time 0 μs to 5 μs and time 30 μs to 31 μs for a total of 6 μs, and in the digital configuration between time 5 μs and 30 μs for a total of 25 μs. This clearly shows tat the comparator is in the power saving digital mode for more than 80% of the comparison cycle time.

Figure 8:
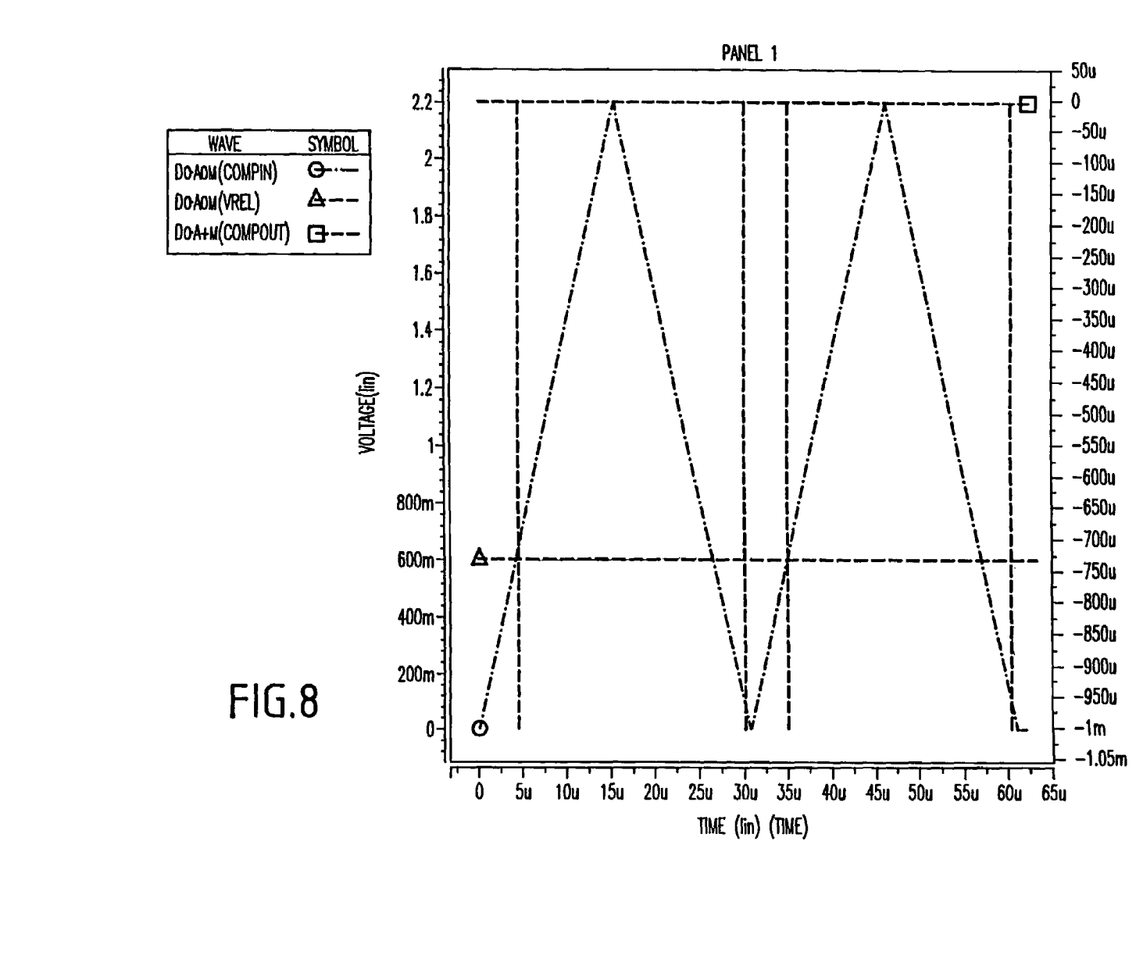
FIG. 8 shows the graphical results from an HSPICE circuit simulation depicting the current through the positive voltage supply $V_{CC}$.

FIG. 8 shows the results of an HSPICE circuit simulation illustrating the power saving feature of the inventive comparator. The COMPIN and $V_{REF}$ waveforms indicated with the X and circle symbols, respectively, are identical to those as seen in FIG. 7. The additional waveform in FIG. 8, indicated by the square symbol at the left edge of the waveform, is the current through the VCC positive power supply. At time 2.11 μs and also at time 32.5 μs, when the comparator is in the analog configuration, the current through $V_{CC}$ is 3.19 μA. At time 16.4 μs and also at time 47.8 μs, when the comparator is in the digital configuration, the current through $V_{CC}$ is only 13.8 nA.

The data in Table 1 demonstrates that a wide voltage range is achievable for the falling edge trip point voltage V−. Additionally, when adjusting the transistor aspect ratios of T1 and T3, it is preferable to only adjust the aspect ratio of T1 because T2 and T3 should be identical for the case, where COMPIN is rising and the comparator is in the analog configuration described previously. Any limitations on the width-to-length ratios of T1 and T3 are due to the minimum manufacturable transistor channel width and length allowed byte particular CMOS technology. In general, however, the ratio $(W_{T1}/L_{T1})$ will be much less than 1 and the ratio $(W_{T3}/L_{T3})$ will be much greater than 1. As an example, in a 0.18 μm technology, $(W_{T1}/L_{T1})$ might assume a value of 1 μm/32 μm, resulting in a ratio of 0.03125, and $(W_{T3}/L_{T3})$ could be realized in a value of 48 μm/0.18 μm for a ratio of 266.667, where $L_{T3}$ is the minimum channel length.

In the present invention, the aspect ratios of T1 and T3 and, thus, the falling edge trip point, are considered permanent for a particular build of hardware. However, it is conceivable, and possible, that the aspect ratios of T1 and T3 could be programmable and dynamically configurable, allowing for adjustment of the trip point on a case-by-case basis. This is accomplished by implementing T1 and T3 as multi-fingered devices, with device fingers capable of being added or removed via CMOS transmission gate switches to increase or decrease the total channel width of the device, respectively. The ability to raise and lower the trip point of the falling edge of COMPIN is important because it allows for the adjustment of the amount of hysteresis incorporated into the design. Another important use of an adjustable trip point involves the ability to control the delay between the rising and falling edge transitions at the comparator output COMPOUT and, in turn, the pulse width at COMPOUT. This use has several applications where the same analog signal AS1 is used to generate or derive a digital data signal D1 as well as a digital clock signal C1. Moreover, D1 and C1 are then provided to a latch as the data and clock inputs, respectively. This assumes that the D1 data is a logic high and is to be captured into the latch on the falling edge of the C1 clock. This means that the high D1 data to be captured with fidelity must not transition to a logic low until after the falling edge of the C1 clock, which means that the falling edge of D1 must not occur until after the falling edge of the C1 clock.

This situation can be satisfied through the use of two present inventive comparators having two different and unique falling edge trip points, both of which are fed analog input AS1 with the two comparator outputs being data D1 and clock C1.

Figure 9:
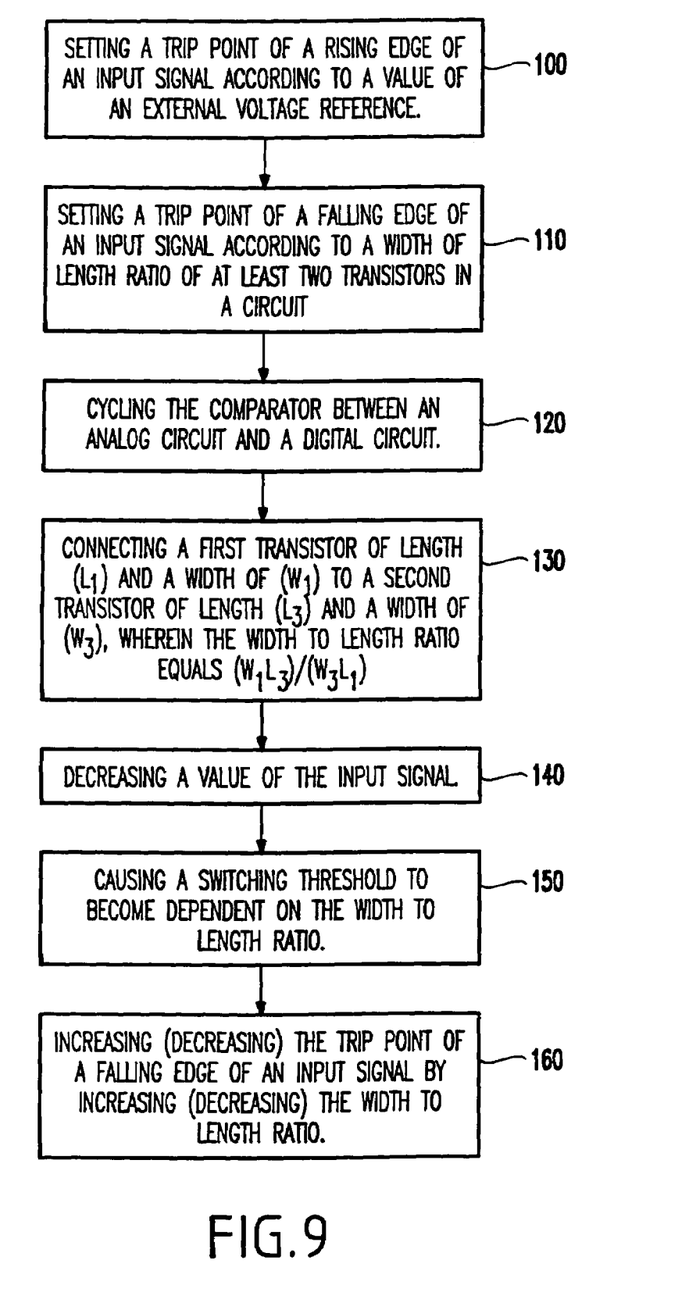
FIG. 9 is a flow diagram illustrating a preferred method of the present invention.

Finally, FIG. 9 shows a flow diagram illustrating a preferred method for comparing an input signal to a reference signal using a comparator, wherein the method comprises, first, setting 100 a trip point of a rising edge of an input signal according to a value of an external voltage reference. The next step involves setting 110 a trip point of a falling edge of an input signal according to a width-to-length ratio of at least two transistors in a circuit. Then, a step of cycling 120 the comparator between an analog circuit and a digital circuit occurs. The method further comprises connecting 130 a first transistor of length ($L_{T1}$) and a width of ($W_{T1}$) to a second transistor of length ($L_{T3}$) and a width of ($W_{T3}$), wherein the width-to-length ratio equals ($W_{T1}L_{T3}$)/($W_{T3}L_{T1}$). Other steps involve 140 decreasing a value of the input signal and causing 150 a switching threshold to become dependent on the width-to-length ratio. The method further comprises 160 increasing (decreasing) the trip point of a falling edge of an input signal by increasing (decreasing) the width-to-length ratio.

There are several benefits of the present invention, including the ability to control different trip points for the rising and falling edges of an input signal. Also, the present invention provides a comparator which dissipates less power than conventional devices. Moreover, the present invention is ideal for use in low power applications.

Again, the ability to raise and lower the trip point of the falling edge of the input signal is important because it allows for adjustment of the amount of hysteresis incorporated into the design. Another important use of an adjustable trip point involves the ability to control the delay between the rising and falling edge transitions at the comparator output signal and, in turn, the pulse width at the output. This use has several applications where the same analog signal is used to generate or derive a digital data signal, as well as a digital clock signal.

While the invention has been described in terms of preferred embodiments, those skilled in the art will recognize that the invention can be practiced with modification within the spirit and scope of the appended claims.

What is claimed is:

1. A comparator cycling between an analog configuration and a digital configuration, said comparator comprising:
    at least two transistors;
    a plurality of transmission gates coupled to said transistors and adapted to select a reference signal and a comparator output signal for signal selection; and
    a plurality of invertors coupled to said plurality of transmission gates, wherein said plurality of inventors are operable to buffer said comparator output signal, wherein the buffered output signal is returned as two signals to control said plurality of transmission gates,
    wherein said comparator is set to have a first trip point associated with a rising edge of an input signal according to a value of a positive external voltage reference, and a second trip point associated with a falling edge of said input signal according to a width-to-length ratio of said transistors,
    wherein only in said analog configuration one of said transistors is a tail current source transistor, whereby said input signal rises from ground toward a positive power supply voltage, and whereby the rise in said input signal switches said tail current source transistor off,
    wherein one of said first or second trip point is set externally from said comparator, and
    wherein a majority of a cycle time of said comparator is spent in said digital configuration.

2. The comparator of claim 1, wherein said rise in said input signal causes said comparator to appear as a differential pair in an open loop configuration.

3. The comparator of claim 1, wherein in said digital configuration, said input signal is at an input voltage level greater than a level of said positive external voltage reference.

4. The comparator of claim 3, wherein said input signal causes said comparator to have characteristics of an asymmetric inverting Schmitt trigger.

5. The comparator of claim 1, wherein said transistors comprise:
    a first transistor of length ($L_x$) and a width of ($W_x$); and
    a second transistor of length ($L_y$) and a width of ($W_y$),
    wherein said width-to-length ratio equals ($W_xL_y$)/($W_yL_x$), and
    wherein as said input signal decreases, a switching threshold becomes dependent on said width-to-length ratio.

6. The comparator of claim 1, wherein a level of said second trip point decreases by decreasing said width-to-length ratio.

7. The comparator of claim 1, wherein a level of said second trip point increases by increasing said width-to-length ratio.

8. The comparator of claim 1, wherein said comparator spends approximately 80% of said cycle time in said digital configuration.

9. A comparator cycling between an analog configuration and a digital configuration, said comparator comprising:
    a plurality of transistors;

a plurality of transmission gates coupled to said transistors and adapted to select a reference signal and a comparator output signal for signal selection; and a plurality of invertors coupled to said plurality of transmission gates, wherein said plurality of inventors are operable to buffer said comparator output signal, wherein the buffered output signal is returned as two signals to control said plurality of transmission gates, wherein said comparator is set to have a first trip point associated with a rising edge of an input signal according to a value of a positive external voltage reference, and a second trip point of a falling edge of the input signal according to a width-to-length ratio of said transistors, wherein a level of said second trip point is adjustable according to said width-to-length ratio, wherein only in said analog configuration, said device further comprises a tail current source transistor, whereby said input signal rises from ground toward a positive power supply voltage, and whereby said rise in said input signal switches said tail current source transistor off, wherein one of said first or second trip point is set externally from said comparator, and wherein a majority of a cycle time of said comparator is spent in said digital configuration.

10. The comparator in claim 9, wherein said transistors comprises:
a first transistor of length ($L_x$) and a width of ($W_x$); and
a second transistor of length ($L_y$) and a width of ($W_y$), wherein said width-to-length ratio equals ($W_x L_y$)/($W_y L_x$), and
wherein as said input signal decreases, a switching threshold becomes dependent on said width-to-length ratio.

11. The comparator of claim 9, wherein the rise in said input signal causes said comparator to appear as a differential pair in an open loop configuration.

12. The comparator of claim 9, wherein in said digital configuration, said input signal is at an input voltage level greater than a level of said positive external voltage reference.

13. The comparator of claim 12, wherein said input signal causes said comparator to have characteristics of an asymmetric inverting Schmitt trigger.

14. The comparator of claim 9, wherein said comparator spends approximately 80% of said cycle time in said digital configuration.

15. A comparator set to have a pair of trip points corresponding to a voltage value of a rising and falling edge of an input signal, wherein said comparator cycles between an analog configuration and a digital configuration by selective selection of said input signal through a plurality of transmission gates, wherein said comparator controls a delay between rising and falling edge transitions at an output signal of said comparator, wherein said comparator controls a pulse width at said output signal of said comparator, wherein one of said trip points is external to said comparator, and wherein a majority of a cycle time of said comparator is spent in said digital configuration.

16. A comparator set to have a pair of trip points corresponding to a voltage value of a rising and falling edge of an input signal, wherein said comparator cycles between an analog configuration and a digital configuration by selective selection of said input signal through a plurality of transmission gates, wherein said comparator controls a delay between rising and falling edge transitions at an output signal of said comparator, wherein said comparator controls a pulse width at said output signal of said comparator, wherein one of said trip points is external to said comparator, wherein a majority of a cycle time of said comparator is spent in said digital configuration, and wherein said analog configuration comprises:
an input signal terminal;
an output signal terminal;
a positive power supply voltage terminal;
a positive external voltage reference terminal;
a tail current source transistor operatively connected to said positive power supply voltage terminal;
a first pair of transistors operatively connected to said tail current source transistor, said input signal terminal, and said positive external voltage reference terminal;
a second pair of transistors operatively connected to said first pair of transistors, wherein said second pair of transistors operate as current mirror load transistors; and
a plurality of invertors operatively connected to said output signal terminal, said first pair of transistors, and said second pair of transistors, wherein said plurality of invertors are operable to buffer said output signal, wherein the buffered output signal is returned as two signals to control said plurality of transmission gates.

17. A comparator set to have a pair of trip points corresponding to a voltage value of a rising and falling edge of an input signal, wherein said comparator cycles between an analog configuration and a digital configuration by selective selection of said input signal through a plurality of transmission gates, wherein said comparator controls a delay between rising and falling edge transitions at an output signal of said comparator, wherein said comparator controls a pulse width at said output signal of said comparator, wherein one of said trip points is external to said comparator, wherein a majority of a cycle time of said comparator is spent in said digital configuration, and wherein said digital configuration comprises:
an input signal terminal;
an output signal terminal;
a positive power supply voltage terminal;
a tail current source transistor operatively connected to said positive power supply voltage terminal and said input signal terminal;
a first pair of transistors operatively connected to said tail current source transistor and said input signal terminal;
a current mirror load transistor operatively connected to said input signal source and said first pair of transistors; and
a plurality of invertors operatively connected to said output signal terminal, said first pair of transistors, and said current mirror load transistor, wherein said plurality of invertors are operable to buffer said output signal, wherein the buffered output signal is returned as two signals to control said plurality of transmission gates.

18. The comparator of claim 16, wherein in said analog configuration, said input signal rises from ground toward a positive power supply voltage, wherein said rise in said input signal switches said tail current source transistor off.

19. The comparator of claim 17, wherein in said digital configuration, said input signal is at an input voltage level greater than a level of said positive external voltage reference.

20. The comparator of claim 15, wherein said comparator spends approximately 80% of said cycle time in said digital configuration.

* * * * *